United States Patent
Cha et al.

(10) Patent No.: US 12,007,449 B2
(45) Date of Patent: Jun. 11, 2024

(54) BATTERY MANAGEMENT APPARATUS, BATTERY MANAGEMENT METHOD, BATTERY PACK AND ELECTRIC VEHICLE

(71) Applicant: LG Energy Solution, Ltd., Seoul (KR)

(72) Inventors: A-Ming Cha, Daejeon (KR); Yoon-Jung Bae, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 431 days.

(21) Appl. No.: 17/440,905

(22) PCT Filed: Aug. 14, 2020

(86) PCT No.: PCT/KR2020/010918
§ 371 (c)(1),
(2) Date: Sep. 20, 2021

(87) PCT Pub. No.: WO2021/054618
PCT Pub. Date: Mar. 25, 2021

(65) Prior Publication Data
US 2022/0158468 A1 May 19, 2022

(30) Foreign Application Priority Data
Sep. 19, 2019 (KR) .......................... 10-2019-0115464

(51) Int. Cl.
*H02J 7/00* (2006.01)
*B60L 58/12* (2019.01)
(Continued)

(52) U.S. Cl.
CPC ............ *G01R 31/392* (2019.01); *B60L 58/12* (2019.02); *G01R 31/382* (2019.01);
(Continued)

(58) Field of Classification Search
CPC .......................... G01R 31/392; G01R 31/382; G01R 31/3842; G01R 31/396; B60L 58/12;
(Continued)

(56) References Cited

U.S. PATENT DOCUMENTS

2012/0169288 A1 7/2012 Ueki et al.
2013/0314050 A1 11/2013 Matsubara et al.
(Continued)

FOREIGN PATENT DOCUMENTS

CN 107526038 A 12/2017
CN 110031770 A 7/2019
(Continued)

OTHER PUBLICATIONS

Extended European Search Report for Application No. 20866793.1 dated Jul. 8, 2022. 14 pgs.
International Search Report for Application No. PCT/KR2020/010918 mailed Nov. 26, 2020, pp. 1-2.

*Primary Examiner* — Zixuan Zhou
(74) *Attorney, Agent, or Firm* — Bryan Cave Leighton Paisner LLP (57) ABSTRACT

A battery management apparatus, battery management method and battery pack that detects feature points of each of a first differential capacity curve acquired by charging the battery with a first constant current, a second differential capacity curve acquired by discharging the battery with the first constant current, a third differential capacity curve acquired by charging the battery with a second constant current and a fourth differential capacity curve acquired by discharging the battery with the second constant current, and determines degradation information of the battery based on voltage values of the feature points detected from each differential capacity curve.

12 Claims, 6 Drawing Sheets

(51) Int. Cl.
*G01R 31/382* (2019.01)
*G01R 31/3842* (2019.01)
*G01R 31/392* (2019.01)
*G01R 31/396* (2019.01)
*H01M 10/42* (2006.01)
*H01M 10/44* (2006.01)
*H01M 10/48* (2006.01)

(52) U.S. Cl.
CPC ....... *G01R 31/3842* (2019.01); *G01R 31/396* (2019.01); *H01M 10/425* (2013.01); *H01M 10/44* (2013.01); *H01M 10/48* (2013.01); *H02J 7/00036* (2020.01); *H02J 7/0047* (2013.01); *H02J 7/005* (2020.01); *H02J 7/00712* (2020.01); *H02J 7/00714* (2020.01); *B60L 2240/547* (2013.01); *B60L 2240/549* (2013.01); *H01M 2010/4271* (2013.01); *H01M 2220/20* (2013.01)

(58) Field of Classification Search
CPC ....... B60L 2240/547; B60L 2240/549; H01M 10/425; H01M 10/44; H01M 10/48; H01M 2010/4271; H01M 2220/20; H02J 7/00036; H02J 7/0047; H02J 7/005; H02J 7/00712; H02J 7/00714
USPC ....................................................... 320/132
See application file for complete search history.

(56) References Cited

U.S. PATENT DOCUMENTS

| | | |
|---|---|---|
| 2013/0335009 A1 | 12/2013 | Katsumata et al. |
| 2015/0086812 A1 | 3/2015 | Joe et al. |
| 2016/0061908 A1 | 3/2016 | Torai et al. |
| 2017/0212170 A1 | 7/2017 | Torai et al. |
| 2017/0233250 A1 | 8/2017 | Cairns et al. |
| 2019/0168617 A1* | 6/2019 | Ling .................... H01M 10/44 |
| 2019/0221839 A1 | 7/2019 | Inoue et al. |
| 2020/0225292 A1 | 7/2020 | Ukumori et al. |

FOREIGN PATENT DOCUMENTS

| | | | |
|---|---|---|---|
| JP | 2013247003 A | | 12/2013 |
| JP | 2014092471 A | | 5/2014 |
| JP | 2016126887 A | | 7/2016 |
| JP | 6123844 B2 | | 5/2017 |
| JP | 2018147635 A | | 9/2018 |
| JP | 6405754 B2 | | 10/2018 |
| JP | 2018205139 A | | 12/2018 |
| JP | 2019020392 A | | 2/2019 |
| JP | 6485041 B2 | | 3/2019 |
| JP | 2019045351 A | | 3/2019 |
| JP | 2019045351 A | * | 3/2019 |
| KR | 20130142884 A | | 12/2013 |
| KR | 101419920 B1 | | 7/2014 |
| KR | 20170042615 A | | 4/2017 |
| KR | 20190052103 A | | 5/2019 |

* cited by examiner

BATTERY MANAGEMENT APPARATUS, BATTERY MANAGEMENT METHOD, BATTERY PACK AND ELECTRIC VEHICLE

CROSS-REFERENCE TO RELATED APPLICATIONS

The present application is a national phase entry under 35 U.S.C. § 371 of International Application No. PCT/KR2020/010918 filed Aug. 14, 2020, published in Korean, which claims priority from Korean Patent Application No. 10-2019-0115464 filed Sep. 19, 2019, all of which are incorporated herein by reference.

TECHNICAL FIELD

The present disclosure relates to technology for determining degradation information of a battery.

BACKGROUND ART

Recently, there has been a dramatic increase in demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

Information (hereinafter referred to as degradation information) associated with degradation of a battery is determined from a capacity curve indicating a correlation between the voltage and capacity of the battery. However, when the capacity curve has a capacity range in which voltage changes are not clearly observed, it is difficult to accurately determine the degradation information of the battery.

To overcome this disadvantage, instead of the capacity curve, differential capacity analysis (DCA) determines the degradation information of the battery from a differential capacity curve. However, when the differential capacity curve is acquired by performing only one of the charge process and the discharge process or using a single current rate, information associated with the hysteresis characteristics having a strong correlation with the degradation of the battery is not sufficiently reflected on the differential capacity curve.

SUMMARY

Technical Problem

The present disclosure is designed to solve the above-described problem, and therefore the present disclosure is directed to providing a battery management apparatus, a battery management method, a battery pack and an electric vehicle for determining degradation information of a battery from at least four differential capacity curves acquired by performing the charge process and the discharge process at least once using each of at least two constant currents having different current rates.

These and other objects and advantages of the present disclosure may be understood by the following description and will be apparent from the embodiments of the present disclosure. In addition, it will be easily understood that the objects and advantages of the present disclosure may be realized by the means set forth in the appended claims and a combination thereof.

Technical Solution

A battery management apparatus according to an aspect of the present disclosure includes a sensing unit configured to detect a voltage and a current of a battery, and configured to output a sensing signal indicating the detected voltage and the detected current, and a control unit operably coupled to the sensing unit. The control unit determines a first differential capacity curve based on a first voltage history and a first capacity history of the battery acquired for a first period during which the battery is charged with a first constant current. The control unit determines a second differential capacity curve based on a second voltage history and a second capacity history of the battery acquired for a second period during which the battery is discharged with the first constant current. The control unit determines a third differential capacity curve based on a third voltage history and a third capacity history of the battery acquired for a third period during which the battery is charged with a second constant current that is different from the first constant current. The control unit determines a fourth differential capacity curve based on a fourth voltage history and a fourth capacity history of the battery acquired for a fourth period during which the battery is discharged with the second constant current. The control unit detects a first charge feature point from the first differential capacity curve. The control unit detects a first discharge feature point from the second differential capacity curve. The control unit detects a second charge feature point from the third differential capacity curve. The control unit detects a second discharge feature point from the fourth differential capacity curve. The control unit determines degradation information of the battery based on first and second charge feature values and first and second discharge feature values. The first and second charge feature values are voltage values of the first and second charge feature points respectively. The first and second discharge feature values are voltage values of the first and second discharge feature points respectively.

The first charge feature point is an $i^{th}$ peak among a plurality of ordered peaks of the first differential capacity curve. The first discharge feature point is the $i^{th}$ peak among a plurality of ordered peaks of the second differential capacity curve. The second charge feature point is the $i^{th}$ peak among a plurality of ordered peaks of the third differential capacity curve. The second discharge feature point is the $i^{th}$ peak among a plurality of ordered peaks of the fourth differential capacity curve. i is a predetermined value.

The control unit may determine a first hysteresis value indicating an absolute value of difference between the first charge feature value and the first discharge feature value. The control unit may determine a second hysteresis value indicating an absolute value of difference between the second charge feature value and the second discharge feature value. The degradation information may include the first and second hysteresis values.

The degradation information may further include a first difference value which is an absolute value of difference between the first hysteresis value and the second hysteresis value.

The control unit may further detect a third charge feature point from the first differential capacity curve. The control unit may further detect a third discharge feature point from the second differential capacity curve. The control unit may further detect a fourth charge feature point from the third differential capacity curve. The control unit may further detect a fourth discharge feature point from the fourth differential capacity curve. The control unit may determine the degradation information further based on third and fourth charge feature values and third and fourth discharge feature values. The third and fourth charge feature values are voltage values of the third and fourth charge feature points respectively. The third and fourth discharge feature values are voltage values of the third and fourth discharge feature points respectively.

The third charge feature point is a $j^{th}$ peak among a plurality of ordered peaks of the first differential capacity curve. The third discharge feature point is the $j^{th}$ peak among a plurality of ordered peaks of the second differential capacity curve. The fourth charge feature point is the $j^{th}$ peak among a plurality of ordered peaks of the third differential capacity curve. The fourth discharge feature point is the $j^{th}$ peak among a plurality of ordered peaks of the fourth differential capacity curve. j is a predetermined value different from i.

The control unit may determine a third hysteresis value indicating an absolute value of difference between the third charge feature value and the third discharge charge feature value. The control unit may determine a fourth hysteresis value indicating an absolute value of difference between the fourth charge feature value and the fourth discharge feature value. The degradation information may further include the third and fourth hysteresis values.

The degradation information may further include at least one of a second difference value which is an absolute value of difference between the third hysteresis value and the fourth hysteresis value, a third difference value which is an absolute value of difference between the first hysteresis value and the third hysteresis value, or a fourth difference value which is an absolute value of difference between the second hysteresis value and the fourth hysteresis value.

The control unit may determine a maximum current rate allowable for charge and discharge of the battery based on the degradation information.

A battery pack according to another aspect of the present disclosure includes a battery management apparatus according to any of the embodiments described herein.

An electric vehicle according to still another aspect of the present disclosure includes the battery pack.

A battery management method according to further another aspect of the present disclosure uses the battery management apparatus of any of the embodiments described herein. The battery management method includes determining, by the control unit, the first differential capacity curve based on the first voltage history and the first capacity history of the battery acquired for the first period during which the battery is charged with the first constant current, determining, by the control unit, the second differential capacity curve based on the second voltage history and the second capacity history of the battery acquired for the second period during which the battery is discharged with the first constant current, determining, by the control unit, the third differential capacity curve based on the third voltage history and the third capacity history of the battery acquired for the third period during which the battery is charged with the second constant current, determining, by the control unit, the fourth differential capacity curve based on the fourth voltage history and the fourth capacity history of the battery acquired for the fourth period during which the battery is discharged with the second constant current, detecting, by the control unit, the first charge feature point from the first differential capacity curve, detecting, by the control unit, the first discharge feature point from the second differential capacity curve, detecting, by the control unit, the second charge feature point from the third differential capacity curve, detecting, by the control unit, the second discharge feature point from the fourth differential capacity curve, and determining, by the control unit, the degradation information based on the first and second charge feature values and the first and second discharge feature values.

Advantageous Effects

According to at least one of the embodiments of the present disclosure, it is possible to determine degradation information of a battery from at least four differential capacity curves acquired by performing the charge process and the discharge process at least once using each of different constant currents.

The effects of the present disclosure are not limited to the above-mentioned effects, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and may be implemented by hardware or software alone or in combination.

In addition, throughout the specification, it will be further understood that when an element is referred to as being "connected to" another element, it can be directly connected to the other element or intervening elements may be present.

Figure 1:
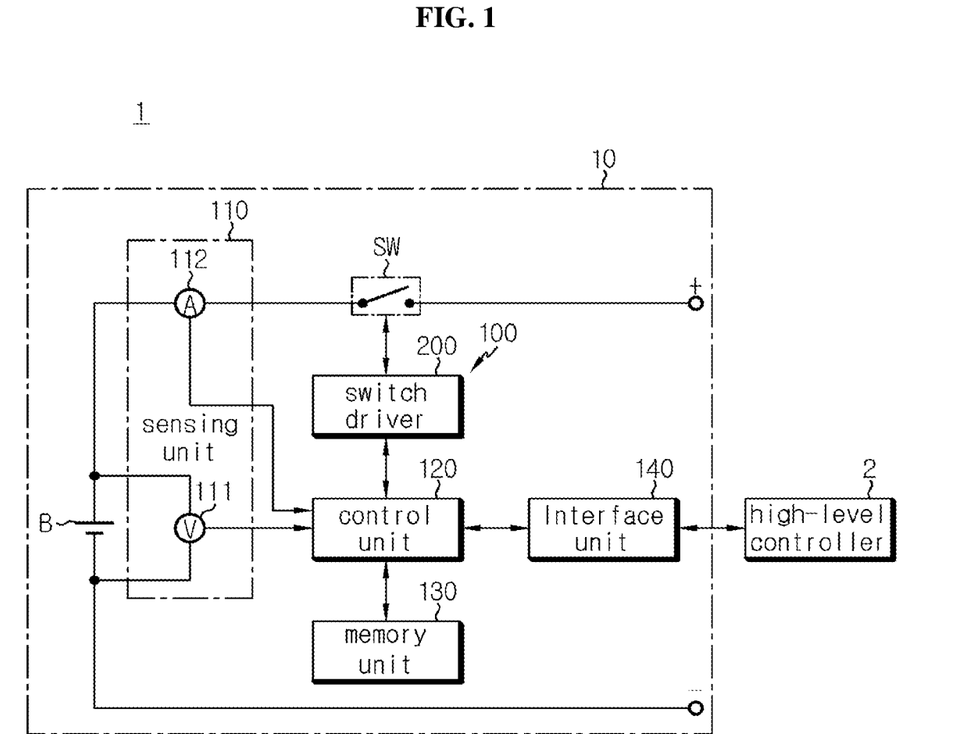
FIG. 1 is a diagram exemplarily showing a configuration of an electrical system according to an embodiment of the present disclosure.
Figure 2:
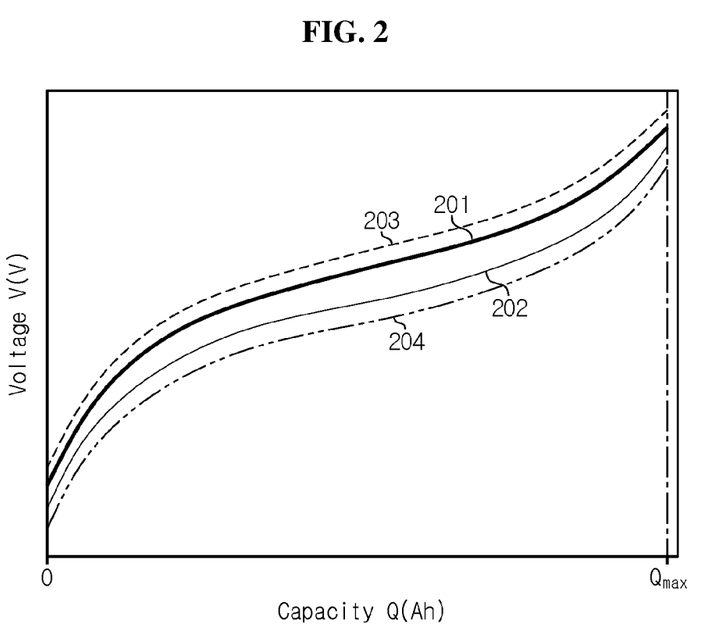
FIG. 2 is a graph exemplarily showing first to fourth capacity curves determined by a battery management apparatus of FIG. 1.

FIG. 1 is a diagram exemplarily showing a configuration of an electrical system according to an embodiment of the present disclosure, and FIG. 2 is a graph exemplarily showing first to fourth capacity curves determined by a battery management apparatus of FIG. 1.

Referring to FIG. 1, the battery pack 10 is provided to be installed in an electrical system 1 (e.g., an electric vehicle), and includes a battery B, a switch SW and a battery management apparatus 100.

Positive and negative terminals of the battery B are electrically connected to the battery management apparatus 100. The battery B includes at least one unit cell. The unit cell may be, for example, a lithium ion battery. The type of the unit cell is not limited to the lithium ion battery, and any other type of battery cell that can be repeatedly recharged may be used as the unit cell.

The switch SW is installed on a current path for the charge and discharge of the battery B. While the switch SW is turned on, the battery B may be charged and discharged. The switch SW may be a mechanical relay that is turned on or off by the magnetic force of a coil or a semiconductor switch such as a Metal Oxide Semiconductor Field Effect transistor (MOSFET). While the switch SW is turned off, the charge and discharge of the battery B is stopped. The switch SW may be turned on in response to a first switching signal from a switch driver 200. The switch SW may be turned off in response to a second switching signal from the switch driver 200.

The battery management apparatus 100 is provided to determine degradation information of the battery B, and control the charge and discharge of the battery B based on the degradation information.

The battery management apparatus 100 includes a sensing unit 110, a control unit 120 and a memory unit 130. The battery management apparatus 100 may further include at least one of an interface unit 140 or a switch driver 200.

The sensing unit 110 includes a voltage sensor 111 and a current sensor 112.

The voltage sensor 111 is electrically connected to the positive terminal and the negative terminal of the battery B. The voltage sensor 111 is configured to detect a voltage across the battery B at each unit time (e.g., 0.01 sec) while the battery B is charged or discharged. The current sensor 112 is installed on the current path for the charge and discharge of the battery B. The current sensor 112 is configured to detect a current of the battery B at each unit time while the battery B is charged or discharged.

The sensing unit 110 is configured to periodically output a sensing signal indicating the voltage and the current of the battery B detected at each unit time to the control unit 120.

The control unit 120 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing other functions.

The control unit 120 is operably coupled to at least one of the sensing unit 110, the memory unit 130, the interface unit 140 or the switch driver 200.

When at least one of predetermined event(s) occurs, the control unit 120 may command the switch driver 200 to turn on the switch SW. In other situations, the control unit 120 may command the switch driver 200 to turn off the switch SW.

The control unit 120 is configured to acquire data indicating a voltage history, a current history and a capacity history of the battery B over a certain period by recording the sensing signal from the sensing unit 110 in the memory unit 130 in a sequential order. The history of a parameter refers to a time series change of the corresponding parameter over a certain period. The voltage history, the current history and the capacity history of the battery B may be those for the same or different periods. The capacity of the battery B at a specific time point indicates an amount of charges stored in the battery B at the time point. The control unit 120 may determine the capacity history from the current history of the battery B using ampere counting. For example, the capacity of the current cycle is equal to the sum of a capacity change and the capacity of the previous cycle, the capacity change obtained by multiplying the current detected in the current cycle by the unit time.

Referring to FIG. 2, the control unit 120 determines a first capacity curve 201, a second capacity curve 202, a third capacity curve 203 and a fourth capacity curve 204 of the battery B. $Q_{max}$ of FIG. 2 is the maximum capacity of the battery B, and may be the capacity of the battery B when the state of charge (SOC) of the battery B is 100% (i.e., when the battery B is fully charged). $Q_{max}$ gradually decreases as the battery B degrades.

The first capacity curve 201 indicates a correlation between a first voltage history and a first capacity history, acquired for a period (hereinafter referred to as a "first period") during which the battery B is charged with a first constant current of a first current rate (e.g., 0.02 C) from a first SOC (e.g., 0%, 5%) to a second SOC (e.g., 95%, 100%) higher than the first SOC. The first capacity curve 201 is based on the sensing signal periodically output by the sensing unit 110 for the first period. The control unit 120 may control the switch driver 200 to charge the battery B with the constant current of the first current rate for the first period.

The second capacity curve 202 indicates a correlation between a second voltage history and a second capacity history, acquired for a period (hereinafter referred to as a "second period") during which the battery B is discharged with the first constant current from the second SOC to the first SOC. The second capacity curve 202 is based on the sensing signal periodically output by the sensing unit 110 for the second period. The control unit 120 may control the switch driver 200 to discharge the battery B with the second constant current for the second period.

The third capacity curve 203 indicates a correlation between a third voltage history and a third capacity history, acquired for a period (hereinafter referred to as a "third period") during which the battery B is charged with a second constant current of a second current rate (e.g., 0.05 C) that is different from the first current rate from the first SOC to the second SOC. The third capacity curve 203 is based on the sensing signal periodically output by the sensing unit 110 for the third period. The control unit 120 may control the switch driver 200 to charge the battery B with the second constant current for the third period. Hereinafter, it is assumed that the second current rate is higher than the first current rate.

The fourth capacity curve 204 indicates a correlation between a fourth voltage history and a fourth capacity history, acquired for a period (hereinafter referred to as a "fourth period") during which the battery B is discharged with the second constant current from the second SOC to the first SOC. The fourth capacity curve 204 is based on the sensing signal periodically output by the sensing unit 110 for the fourth period. The control unit 120 may control the switch driver 200 to discharge the battery B with the constant current of the second current rate for the fourth period.

The first to fourth periods do not overlap, and they are not limited to a particular order. The control unit 120 may control the charge and discharge of the battery B such that the time interval between two adjacent periods is equal to or less than a predetermined time (e.g., 5 hours). For example, when the first period is the earliest one, the second period comes after the first period, the third period comes after the second period and the fourth period comes after the third period, the control unit 120 may start the second period after a predetermined time (e.g., 3 hours) from the end time of the first period, may start the third period after the predetermined time from the end time of the second period, and may start the fourth period after the predetermined time from the end time of the third period.

In at least part of the capacity range between 0 and $Q_{max}$, there is a voltage difference between the capacity curves 201, 202, 203, 204 at the same capacity. A voltage difference between any two capacity curves results from a voltage drop across the battery B caused by the internal resistance of the battery B when the current flows through the battery B and the hysteresis characteristics of the battery B. The hysteresis characteristics are caused by a difference between the voltage at which phase transition occurs during the charge of the battery B and the voltage at which phase transition occurs during the discharge of the battery B, and as the battery B degrades, and as a larger current flows through the battery B, the hysteresis characteristics may appear more distinctly.

The control unit 120 may determine a voltage change dV and a capacity change dQ of the battery B at each unit time from the first capacity curve 201. The control unit 120 may store, in the memory unit 130, a first data set indicating a correlation of the voltage V, the capacity Q, the voltage change dV and the capacity change dQ of the battery B at each unit time, determined from the first capacity curve 201. The control unit 120 may determine a first differential capacity curve from the first data set. The first differential capacity curve indicates a relationship between the voltage V of the battery B for the first period and a ratio dQ/dV of the capacity change dQ of the battery B to the voltage change dV of the battery B, and may be referred to as a first V-dQ/dV curve.

The control unit 120 may determine a voltage change dV and a capacity change dQ of the battery B at each unit time from the second capacity curve 202. The control unit 120 may store, in the memory unit 130, a second data set indicating a correlation of the voltage V, the capacity Q, the voltage change dV and the capacity change dQ of the battery B at each unit time, determined from the second capacity curve 202. The control unit 120 may determine a second differential capacity curve from the second data set. The second differential capacity curve indicates a relationship between the voltage V of the battery B for the second period and a ratio dQ/dV of the capacity change dQ of the battery B to the voltage change dV of the battery B, and may be referred to as a second V-dQ/dV curve.

The control unit 120 may determine a voltage change dV and a capacity change dQ of the battery B at each unit time from the third capacity curve 203. The control unit 120 may store, in the memory unit 130, a third data set indicating a correlation of the voltage V, the capacity Q, the voltage change dV and the capacity change dQ of the battery B at each unit time, determined from the third capacity curve 203. The control unit 120 may determine a third differential capacity curve from the third data set. The third differential capacity curve indicates a relationship between the voltage V of the battery B for the third period and a ratio dQ/dV of the capacity change dQ to the voltage change dV of the battery B, and may be referred to as a third V-dQ/dV curve.

The control unit 120 may determine a voltage change dV and a capacity change dQ of the battery B at each unit time from the fourth capacity curve 204. The control unit 120 may store, in the memory unit 130, a fourth data set indicating a correlation of the voltage V, the capacity Q, the voltage change dV and the capacity change dQ of the battery B at each unit time, determined from the fourth capacity curve 204. The control unit 120 may determine a fourth differential capacity curve from the fourth data set. The fourth differential capacity curve indicates a relationship between the voltage V of the battery B for the fourth period and a ratio dQ/dV of the capacity change dQ to the voltage change dV of the battery B, and may be referred to as a fourth V-dQ/dV curve.

dQ/dV is a differentiation value obtained by differentiating the capacity Q to the voltage V, and may be referred to as a 'differential capacity'.

The memory unit 130 is operably coupled to the control unit 120. The memory unit 130 may be also operably coupled to the sensing unit 110. The memory unit 130 is configured to store the sensing signal from the sensing unit 110. The memory unit 130 may store data and programs required for the calculation operation by the control unit 120. The memory unit 130 may store data indicating the results of the calculation operation by the control unit 120.

The memory unit 130 may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM).

The switch driver 200 is electrically coupled to the battery management apparatus 100 and the switch SW. The switch driver 200 is configured to selectively output the first switching signal or the second switching signal to the switch SW in response to the command from the battery management apparatus 100.

The interface unit 140 is configured to support the wired or wireless communication between the control unit 120 and a high-level controller 2 (e.g., an Electronic Control Unit (ECU)) of the electrical system 1. The wired communication may be, for example, controller area network (CAN) communication, and the wireless communication may be, for example, Zigbee or Bluetooth communication. The communication protocol is not limited to a particular type, and may include any type of communication protocol that supports the wired or wireless communication between the control unit 120 and the high-level controller 2. The interface unit 140 may include an output device such as a display or a speaker to provide the degradation information of the battery B determined by the control unit 120 in a form that allows the user to recognize. The interface unit 140 may include an input device such as a mouse and a keyboard to receive input data from the user.

Figure 3:
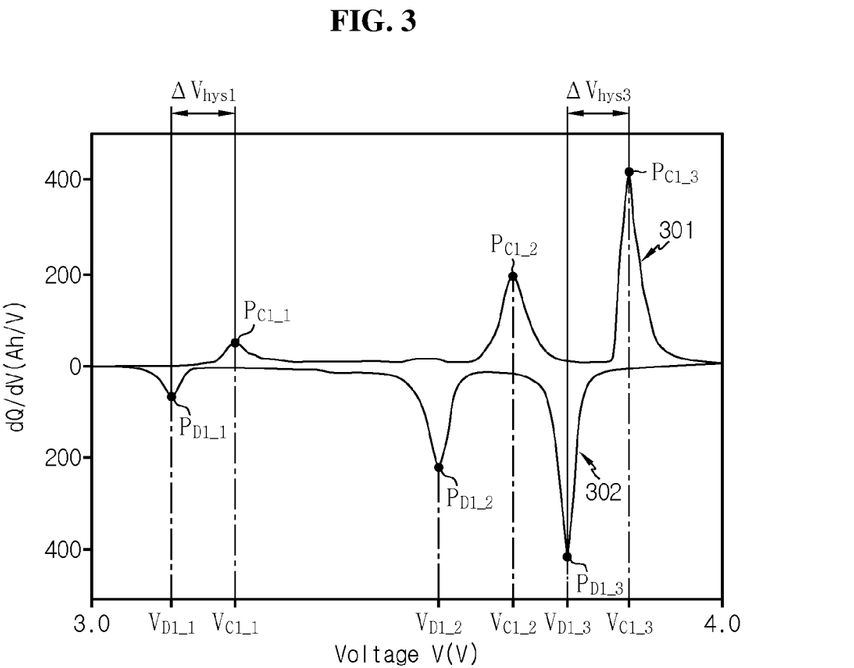
FIG. 3 is a graph exemplarily showing first and second differential capacity curves corresponding to the first and second capacity curves of FIG. 2 with a one-to-one relationship.
Figure 4:
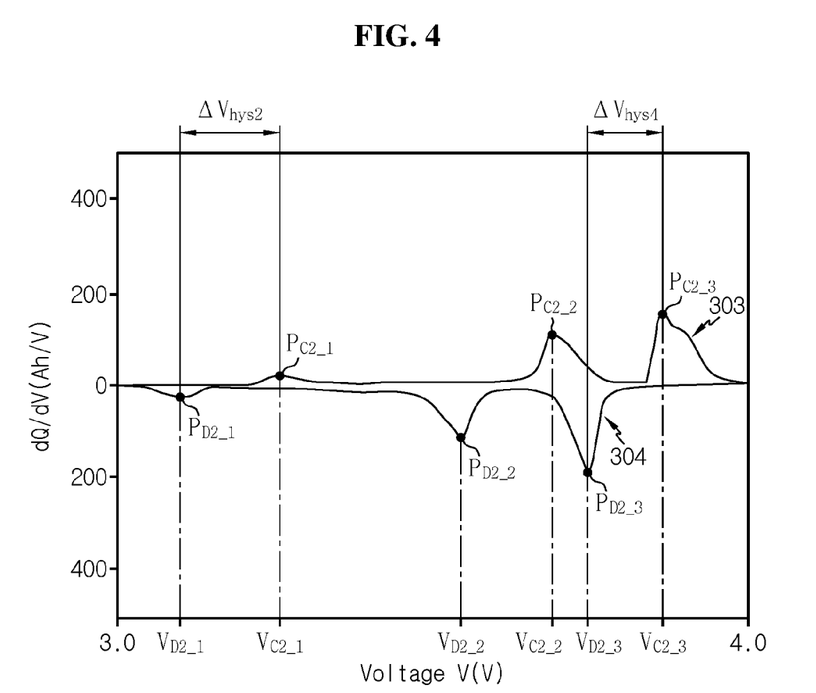
FIG. 4 is a graph exemplarily showing third and fourth differential capacity curves corresponding to the third and fourth capacity curves of FIG. 2 with a one-to-one relationship.

FIG. 3 is a graph exemplarily showing the first and second differential capacity curves corresponding to the first and second capacity curves of FIG. 2 with a one-to-one relationship, and FIG. 4 is a graph exemplarily showing the third and fourth differential capacity curves corresponding to the third and fourth capacity curves of FIG. 2 with a one-to-one relationship.

Referring to FIGS. 3 and 4, the first differential capacity curve 301 may be determined from the first capacity curve 201. The second differential capacity curve 302 may be determined from the second capacity curve 202. The third differential capacity curve 303 may be determined from the third capacity curve 203. The fourth differential capacity curve 304 may be determined from the fourth capacity curve 204.

For ease of understanding, each of the first differential capacity curve 301 and the third differential capacity curve 303 acquired through charging is shown on the upper part of FIGS. 3 and 4, and each of the second differential capacity curve 302 and the fourth differential capacity curve 304 acquired through discharging is shown on the lower part of FIGS. 3 and 4, with respect to the horizontal axis dQ/dV=0 Ah/V.

The number of peaks located on each of the first to fourth differential capacity curves 301, 302, 303, 304 relies on the electrode materials or the like of the battery B. Accordingly, even though the battery B degrades, the total number (or minimum number) of peaks of each of the first to fourth differential capacity curves 301, 302, 303, 304 may be constant. Each peak refers to the relative maximum point or the relative minimum point.

The graphs of FIGS. 3 and 4 show that the first differential capacity curve 301 includes peaks $P_{C1\_1}$, $P_{C1\_2}$, $P_{C1\_3}$, the second differential capacity curve 302 includes peaks $P_{D1\_1}$, $P_{D1\_2}$, $P_{D1\_3}$, the third differential capacity curve 303 includes peaks $P_{C2\_1}$, $P_{C2\_2}$, $P_{C2\_3}$, and the fourth differential capacity curve 304 includes peaks $P_{D2\_1}$, $P_{D2\_2}$, $P_{D2\_3}$.

Each of the peaks $P_{C1\_1}$, $P_{C1\_2}$, $P_{C1\_3}$ of the first differential capacity curve 301 may be referred to as a charge feature point of the first differential capacity curve 301. The control unit 120 may store charge feature values each indicating voltage values $V_{C1\_1}$, $V_{C1\_2}$, $V_{C1\_3}$ of the peaks $P_{C1\_1}$, $P_{C1\_2}$, $P_{C1\_3}$ in the memory unit 130.

Each of the peaks $P_{D1\_1}$, $P_{D1\_2}$, $P_{D1\_3}$ of the second differential capacity curve 302 may be referred to as a discharge feature point of the second differential capacity curve 302. The control unit 120 may store discharge feature values each indicating voltage values $V_{D1\_1}$, $V_{D1\_2}$, $V_{D1\_3}$ of the peaks $P_{D1\_1}$, $P_{D1\_2}$, $P_{D1\_3}$ in the memory unit 130.

Each of the peaks $P_{C2\_1}$, $P_{C2\_2}$, $P_{C2\_3}$ of the third differential capacity curve 303 may be referred to as a charge feature point of the third differential capacity curve 303. The control unit 120 may store charge feature values each indicating voltage values $V_{C2\_1}$, $V_{C2\_2}$, $V_{C2\_3}$ of the peaks $P_{C2\_1}$, $P_{C2\_2}$, $P_{C2\_3}$ in the memory unit 130.

Each of the peaks $P_{D2\_1}$, $P_{D2\_2}$, $P_{D2\_3}$ of the fourth differential capacity curve 304 may be referred to as a discharge feature point of the fourth differential capacity curve 304. The control unit 120 may store discharge feature values each indicating voltage values $V_{D2\_1}$, $V_{D2\_2}$, $V_{D2\_3}$ of the peaks $P_{D2\_1}$, $P_{D2\_2}$, $P_{D2\_3}$ in the memory unit 130.

The first differential capacity curve 301 has the peak $_{C1\_1}$, the peak $_{C1\_2}$ and the peak $_{C1\_3}$ in the ascending order of the voltage V. The second differential capacity curve 302 has the peak $_{D1\_1}$, the peak $_{D1\_2}$ and the peak $_{D1\_3}$ in the ascending order of the voltage V. The third differential capacity curve 303 has the peak $_{C2\_1}$, the peak $_{C2\_2}$ and the peak $_{C2\_3}$ in the ascending order of the voltage V. The fourth differential capacity curve 304 has the peak $_{D2\_1}$, the peak $_{D2\_2}$ and the peak $_{D2\_3}$ in the ascending order of the voltage V.

In the first to fourth differential capacity curves 301, 302, 303, 304, it is assumed that the peaks $P_{C1\_1}$, $P_{D1\_1}$, $P_{C2\_1}$, $P_{D2\_1}$ are located in the same order, the peaks $P_{C1\_2}$, $P_{D1\_2}$, $P_{C2\_2}$, $P_{D2\_2}$ are located in the same order, and the peaks $P_{C1\_3}$, $P_{D1\_3}$, $P_{C2\_3}$, $P_{D2\_3}$ are located in the same order.

Referring to FIGS. 3 and 4, in the first differential capacity curve 301 and the third differential capacity curve 303 respectively acquired by charging the battery B with the first constant current and the second constant current, two charge feature points located in the same order have different charge voltage values. That is, the charge feature value $V_{C2\_1}$ is larger than the charge feature value $V_{C1\_1}$, the charge feature value $V_{C2\_2}$ is larger than the charge feature value $V_{C1\_2}$, and the charge feature value $V_{C2\_3}$ is larger than the charge feature value $V_{C1\_3}$.

Additionally, in the second differential capacity curve 302 and the fourth differential capacity curve 304 respectively acquired by discharging the battery B with the first constant current and the second constant current, two discharge feature points located in the same order have different discharge voltage values. That is, the discharge feature value $V_{D2\_1}$ is smaller than the discharge feature value $V_{D1\_1}$, the discharge feature value $V_{D2\_2}$ is smaller than the discharge feature value $V_{D1\_2}$, and the discharge feature value $V_{D2\_3}$ is smaller than the discharge feature value $V_{D1\_3}$.

From the foregoing, it can be seen that a voltage difference between the charge feature point and the discharge feature point located in the same order of the third differential capacity curve 303 and the fourth differential capacity curve 304 is larger than a voltage difference between the charge feature point and the discharge feature point located in the same order of the first differential capacity curve 301 and the second differential capacity curve 302. In an example, a difference between the charge feature value $V_{C2\_1}$ and the discharge feature value $V_{D2\_1}$ is larger than a difference between the charge feature value $V_{C1\_1}$ and the discharge feature value $V_{D1\_1}$. In another example, a difference between the charge feature value $V_{C2\_2}$ and the discharge feature value $V_{D2\_2}$ is larger than a difference between the charge feature value $V_{C1\_2}$ and the discharge feature value $V_{D1\_2}$. In still another example, a difference between the charge feature value $V_{C2\_3}$ and the discharge feature value $V_{D2\_3}$ is larger than a difference between the charge feature value $V_{C1\_3}$ and the discharge feature value $V_{D1\_3}$.

Figure 5:
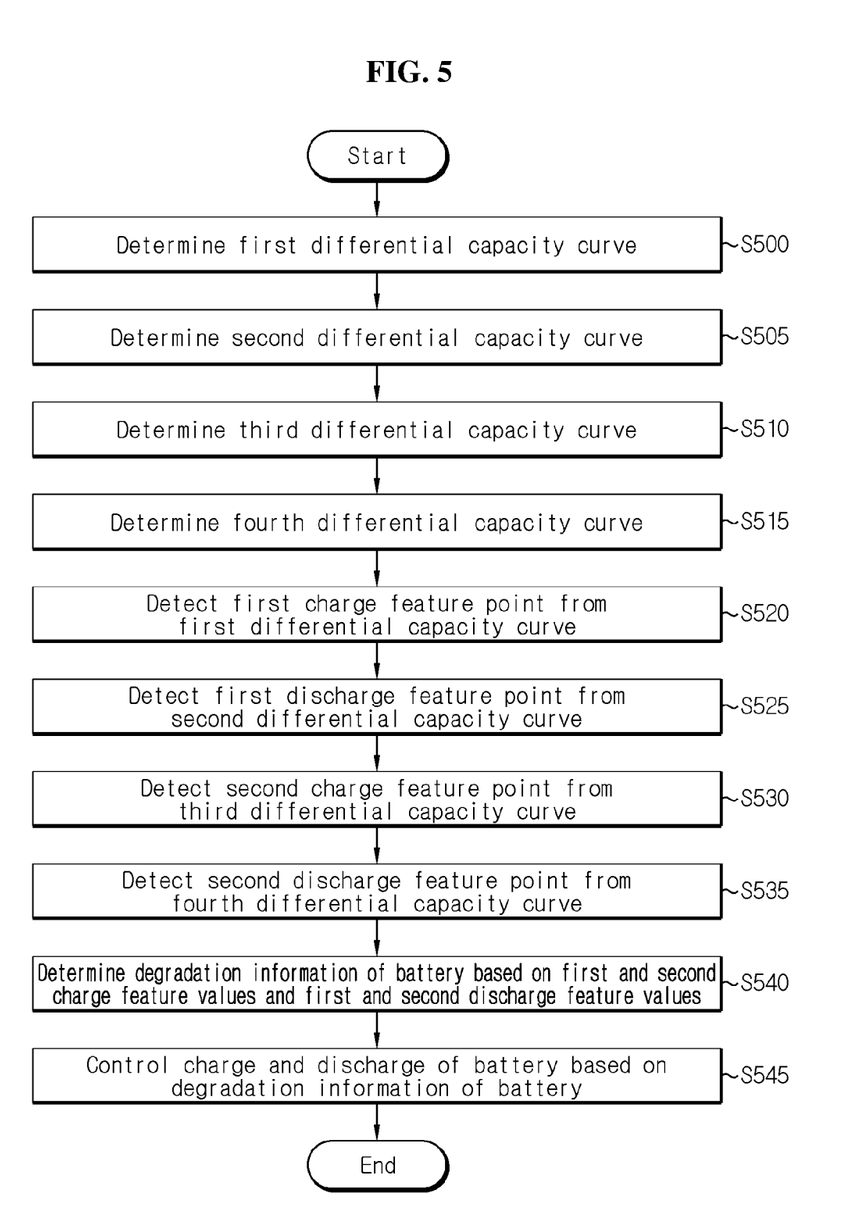
FIG. 5 is a flowchart exemplarily showing a battery management method according to a first embodiment of the present disclosure.

FIG. 5 is a flowchart exemplarily showing a battery management method according to a first embodiment of the present disclosure.

Referring to FIGS. 1 to 5, in step S500, the control unit 120 determines a first differential capacity curve 301, based on a first voltage history and a first capacity history of the battery B acquired for a first period during which the battery B is charged with a first constant current.

In step S505, the control unit 120 determines a second differential capacity curve 302 based on a second voltage history and a second capacity history of the battery B acquired for a second period during which the battery B is discharged with the first constant current.

In step S510, the control unit 120 determines a third differential capacity curve 303 based on a third voltage history and a third capacity history of the battery B acquired for a third period during which the battery B is charged with a second constant current.

In step S515, the control unit 120 determines a fourth differential capacity curve 304 based on a fourth voltage history and a fourth capacity history of the battery B acquired for a fourth period during which the battery B is discharged with the second constant current.

In step S520, the control unit 120 detects a first charge feature point from the first differential capacity curve 301. The first charge feature point may be a peak located in a first predetermined order among the peaks $P_{C1\_1}$, $P_{C1\_2}$, $P_{C1\_3}$ of the first differential capacity curve 301. For example, the first predetermined order may be the first in the ascending order of voltage, and in this case, the peak $_{C1\_1}$ may be determined as the first charge feature point.

In step S525, the control unit 120 detects a first discharge feature point from the second differential capacity curve 302. The first discharge feature point may be a peak located in the first predetermined order among the peaks $P_{D1\_1}$, $P_{D1\_2}$, $P_{D1\_3}$ of the second differential capacity curve 302. For example, the peak $_{D1\_1}$ may be determined as the first discharge feature point.

In step S530, the control unit 120 detects a second charge feature point from the third differential capacity curve 303. The second charge feature point may be a peak located in the first predetermined order among the peaks $P_{C2\_1}$, $P_{C2\_2}$, $P_{C2\_3}$ of the third differential capacity curve 303. For example, the peak $_{C2\_1}$ may be determined as the second charge feature point.

In step S535, the control unit 120 detects a second discharge feature point from the fourth differential capacity curve 304. The second discharge feature point may be a peak located in the first predetermined order among the peaks $P_{D2\_1}$, $P_{D2\_2}$, $P_{D2\_3}$ of the fourth differential capacity curve 304. For example, the peak $_{D2\_1}$ may be determined as the second discharge feature point.

In step S540, the control unit 120 determines degradation information of the battery B based on the first and second charge feature values and the first and second discharge feature values. The degradation information includes a first hysteresis value $\Delta V_{hys1}$ and a second hysteresis value $\Delta V_{hys2}$. The first hysteresis value $\Delta V_{hys1}$ indicates an absolute value of difference between the first charge feature value $V_{C1\_1}$ and the first discharge feature value $V_{D1\_1}$. The second hysteresis value $\Delta V_{hys2}$ indicates an absolute value of difference between the second charge feature value $V_{C2\_1}$ and the second discharge feature value $V_{D2\_1}$. The degradation information may further include a first difference value which is an absolute value of difference between the first hysteresis value $\Delta V_{hys1}$ and the second hysteresis value $\Delta V_{hys2}$.

In step S545, the control unit 120 controls the charge and discharge of the battery B based on the degradation information of the battery B.

For example, when the first difference value is larger than a first threshold value, the control unit 120 may decrease a maximum allowable current rate of the battery B, decrease an end-of-charge voltage of the battery B, or increase an end-of-discharge voltage of the battery B. The first threshold value may be preset, taking the electrical and chemical properties of the battery B into account.

The maximum allowable current rate may be a maximum of current rate allowed for the charge and discharge of the battery B. The end-of-charge voltage may be a maximum of allowable voltage for the charge of the battery B. The end-of-discharge voltage may be a minimum of allowable voltage for the discharge of the battery B. The decrease in the maximum allowable current rate, the decrease in the end-of-charge voltage and the increase in the end-of-discharge voltage may be proportional to a ratio of the first difference value to the first threshold value. For example, when the first difference value is 1.1 times larger than the first threshold value, the maximum allowable current rate may decrease at the ratio of 1/1.1 to the previous one.

Figure 6:
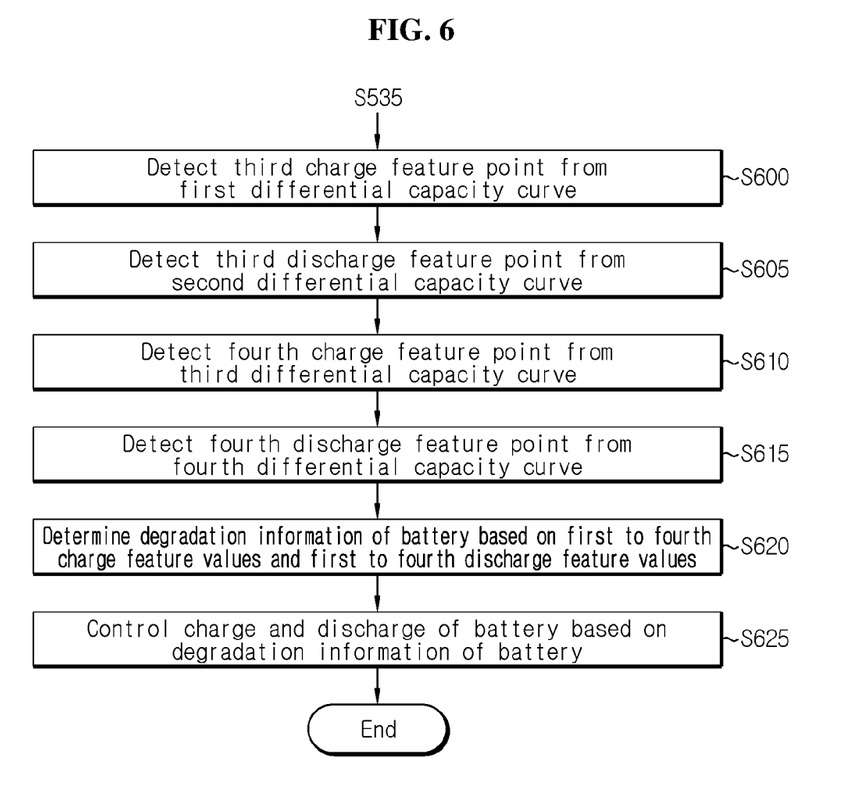
FIG. 6 is a flowchart exemplarily showing a battery management method according to a second embodiment of the present disclosure.

FIG. 6 is a flowchart exemplarily showing a battery management method according to a second embodiment of the present disclosure. The battery management method according to the second embodiment includes the same steps S500~S535 as the battery management method according to the first embodiment described above with reference to FIG. 5. Hereinafter, difference(s) from the battery management method according to the first embodiment will be described.

Referring to FIGS. 1 to 6, in step S600, the control unit 120 detects a third charge feature point from the first differential capacity curve 301. The third charge feature point may be a peak located in a second predetermined order among the peaks $P_{C1\_1}$, $P_{C1\_2}$, $P_{C1\_3}$ of the first differential capacity curve 301. For example, the second predetermined order may be the third one in the ascending order of voltage, and in this case, the peak $_{C1\_3}$ may be determined as the third charge feature point.

In step S605, the control unit 120 detects a third discharge feature point from the second differential capacity curve 302. The third discharge feature point may be a peak located in the second predetermined order among the peaks $P_{D1\_1}$, $P_{D1\_2}$, $P_{D1\_3}$ of the second differential capacity curve 302. For example, the peak $_{D1\_3}$ may be determined as the third discharge feature point.

In step S610, the control unit 120 detects a fourth charge feature point from the third differential capacity curve 303. The fourth charge feature point may be a peak located in the second predetermined order among the peaks $P_{C2\_1}$, $P_{C2\_2}$, $P_{C2\_3}$ of the third differential capacity curve 303. For example, the peak $_{C2\_3}$ may be determined as the fourth charge feature point.

In step S615, the control unit 120 detects a fourth discharge feature point from the fourth differential capacity curve 304. The fourth discharge feature point may be a peak located in the second predetermined order among the peaks $P_{D2\_1}$, $P_{D2\_2}$, $P_{D2\_3}$ of the fourth differential capacity curve 304. For example, the peak $_{D2\_3}$ may be determined as the fourth discharge feature point.

In step S620, the control unit 120 determines degradation information of the battery B based on the first to fourth charge feature values and the first to fourth discharge feature values. The degradation information includes first to fourth hysteresis values. The third hysteresis value $\Delta V_{hys3}$ indicates an absolute value of difference between the third charge feature value $V_{C1\_3}$ and the third discharge feature value $V_{D1\_3}$. The fourth hysteresis value $\Delta V_{hys4}$ indicates an absolute value between difference between the fourth charge feature value $V_{C2\_3}$ and the fourth discharge feature value $V_{D2\_3}$. The degradation information may further include a second difference value which is an absolute value of difference between the third hysteresis value $\Delta V_{hys3}$ and the fourth hysteresis value $\Delta V_{hys4}$. The degradation information may further include a third difference value which is an absolute value of difference between the first hysteresis value $\Delta V_{hys1}$ and the third hysteresis value $\Delta V_{hys3}$. The degradation information may further include a fourth difference value which is an absolute value of difference between the second hysteresis value $\Delta V_{hys2}$ and the fourth hysteresis value $\Delta V_{hys4}$.

In step S625, the control unit 120 controls the charge and discharge of the battery B based on the degradation information of the battery B.

In an example, when the second difference value is larger than a second threshold value, the third difference value is larger than a third threshold value, or the fourth difference value is larger than a fourth threshold value, the control unit 120 may decrease the maximum allowable current rate of the battery B, decrease the end-of-charge voltage of the battery B, or increase the end-of-discharge voltage of the battery B. Each of the second to fourth threshold values may be preset, taking the electrical and chemical properties of the battery B into account. The decrease in the maximum allowable current rate, the decrease in the end-of-charge voltage and the increase in the end-of-discharge voltage may be proportional to the largest one of a ratio of the first difference value to the first threshold value, a ratio of the second difference value to the second threshold value, a ratio of the third difference value to the third threshold value and a ratio of the fourth difference value to the fourth threshold value. For example, when the first difference value is 1.1 times larger than the first threshold value and the second difference value is 1.2 times larger than the second threshold value, the maximum allowable current rate may decrease at the ratio of 1/1.2 to the previous one.

In another example, when the ratio of the second difference value to the first difference value is outside of a first threshold range or the ratio of the fourth difference value to the third difference value is outside of a second threshold range, the control unit 120 may decrease the maximum allowable current rate of the battery B, decrease the end-of-charge voltage of the battery B, or increase the end-of-discharge voltage of the battery B. Each of the first and second threshold ranges may be preset, taking the electrical and chemical properties or the like of the battery B into account. The decrease in the maximum allowable current rate, the decrease in the end-of-charge voltage and the increase in the end-of-discharge voltage may be proportional to a larger one of a ratio of the second difference value to the first difference value and a ratio of the fourth difference value to the third difference value.

The embodiments of the present disclosure described hereinabove are not implemented only through the apparatus and method, and may be implemented through programs that realize the functions corresponding to the configurations of the embodiments of the present disclosure or recording media having the programs recorded thereon, and such implementation may be easily achieved by those skilled in the art from the disclosure of the embodiments previously described.

Additionally, as many substitutions, modifications and changes may be made to the present disclosure by those skilled in the art without departing from the technical aspects of the present disclosure, the present disclosure is not limited by the foregoing embodiments and the accompanying drawings, and some or all of the embodiments may be selectively combined to make various modifications to the present disclosure.

What is claimed is:

1. A battery management apparatus comprising:
a sensing unit configured to detect a voltage and a current of a battery, and configured to output a sensing signal indicating the detected voltage and the detected current; and
a control unit operably coupled to the sensing unit,
wherein the control unit is configured to:
determine a first differential capacity curve based on a first voltage history and a first capacity history of the battery acquired for a first period during which the battery is charged with a first constant current,
determine a second differential capacity curve based on a second voltage history and a second capacity history of the battery acquired for a second period during which the battery is discharged with the first constant current,
determine a third differential capacity curve based on a third voltage history and a third capacity history of the battery acquired for a third period during which the battery is charged with a second constant current that is different from the first constant current,
determine a fourth differential capacity curve based on a fourth voltage history and a fourth capacity history of the battery acquired for a fourth period during which the battery is discharged with the second constant current,
detect a first charge feature point from the first differential capacity curve,
detect a first discharge feature point from the second differential capacity curve,
detect a second charge feature point from the third differential capacity curve,
detect a second discharge feature point from the fourth differential capacity curve, and
determine degradation information of the battery based on first and second charge feature values and first and second discharge feature values,
wherein the first and second charge feature values are voltage values of the first and second charge feature points, respectively, and
the first and second discharge feature values are voltage values of the first and second discharge feature points, respectively.

2. The battery management apparatus according to claim 1, wherein the first charge feature point is an $i^{th}$ peak among a plurality of ordered peaks of the first differential capacity curve,
the first discharge feature point is the $i^{th}$ peak among a plurality of ordered peaks of the second differential capacity curve,
the second charge feature point is the $i^{th}$ peak among a plurality of ordered peaks of the third differential capacity curve, and
the second discharge feature point is the $i^{th}$ peak among a plurality of ordered peaks of the fourth differential capacity curve,
wherein i is a predetermined value.

3. The battery management apparatus according to claim 2, wherein the control unit is configured to:
determine a first hysteresis value indicating an absolute value of difference between the first charge feature value and the first discharge feature value, and determine a second hysteresis value indicating an absolute value of difference between the second charge feature value and the second discharge feature value, wherein the degradation information includes the first and second hysteresis values.

4. The battery management apparatus according to claim 3, wherein the degradation information further includes a first difference value which is an absolute value of difference between the first hysteresis value and the second hysteresis value.

5. The battery management apparatus according to claim 3, wherein the control unit is further configured to:
   detect a third charge feature point from the first differential capacity curve,
   detect a third discharge feature point from the second differential capacity curve,
   detect a fourth charge feature point from the third differential capacity curve,
   detect a fourth discharge feature point from the fourth differential capacity curve, and
   determine the degradation information further based on third and fourth charge feature values and third and fourth discharge feature values,
   wherein the third and fourth charge feature values are voltage values of the third and fourth charge feature points respectively, and
   the third and fourth discharge feature values are voltage values of the third and fourth discharge feature points respectively.

6. The battery management apparatus according to claim 5, wherein the third charge feature point is a $j^{th}$ peak among a plurality of ordered peaks of the first differential capacity curve,
   the third discharge feature point is the $j^{th}$ peak among a plurality of ordered peaks of the second differential capacity curve,
   the fourth charge feature point is the $j^{th}$ peak among a plurality of ordered peaks of the third differential capacity curve, and
   the fourth discharge feature point is the $j^{th}$ peak among a plurality of ordered peaks of the fourth differential capacity curve,
   wherein j is a predetermined value different from i.

7. The battery management apparatus according to claim 6, wherein the control unit is configured to:
   determine a third hysteresis value indicating an absolute value of difference between the third charge feature value and the third discharge charge feature value, and
   determine a fourth hysteresis value indicating an absolute value of difference between the fourth charge feature value and the fourth discharge feature value,
   wherein the degradation information further includes the third and fourth hysteresis values.

8. The battery management apparatus according to claim 7, wherein the degradation information further includes at least one of a second difference value which is an absolute value of difference between the third hysteresis value and the fourth hysteresis value, a third difference value which is an absolute value of difference between the first hysteresis value and the third hysteresis value, or a fourth difference value which is an absolute value of difference between the second hysteresis value and the fourth hysteresis value.

9. The battery management apparatus according to claim 1, wherein the control unit is configured to determine a maximum current rate allowable for charge and discharge of the battery based on the degradation information.

10. A battery pack comprising the battery management apparatus according to claim 1.

11. An electric vehicle comprising the battery pack according to claim 10.

12. A battery management method using a battery management apparatus that includes a sensing unit configured to detect a voltage and a current of a battery and a control unit operably coupled to the sensing unit, the battery management method comprising:
   determining, by the control unit, a first differential capacity curve based on a first voltage history and a first capacity history of the battery acquired for a first period during which the battery is charged with a first constant current;
   determining, by the control unit, a second differential capacity curve based on a second voltage history and a second capacity history of the battery acquired for a second period during which the battery is discharged with the first constant current;
   determining, by the control unit, a third differential capacity curve based on a third voltage history and a third capacity history of the battery acquired for a third period during which the battery is charged with a second constant current;
   determining, by the control unit, a fourth differential capacity curve based on a fourth voltage history and a fourth capacity history of the battery acquired for a fourth period during which the battery is discharged with the second constant current;
   detecting, by the control unit, a first charge feature point from the first differential capacity curve;
   detecting, by the control unit, a first discharge feature point from the second differential capacity curve;
   detecting, by the control unit, a second charge feature point from the third differential capacity curve;
   detecting, by the control unit, a second discharge feature point from the fourth differential capacity curve; and
   determining, by the control unit, degradation information based on first and second charge feature values and first and second discharge feature values,
   wherein the first and second charge feature values are voltage values of the first and second charge feature points, respectively, and
   the first and second discharge feature values are voltage values of the first and second discharge feature points, respectively.

* * * * *